United States Patent

Morita

(10) Patent No.: US 9,852,975 B2
(45) Date of Patent: Dec. 26, 2017

(54) WIRING BOARD, ELECTRONIC DEVICE, AND ELECTRONIC MODULE

(71) Applicant: KYOCERA Corporation, Kyoto-shi, Kyoto (JP)

(72) Inventor: Yukio Morita, Kyoto (JP)

(73) Assignee: KYOCERA Corporation, Kyoto-shi, Kyoto (JP)

( * ) Notice: Subject to any disclaimer, the term of this patent is extended or adjusted under 35 U.S.C. 154(b) by 0 days.

(21) Appl. No.: 15/322,217

(22) PCT Filed: Jul. 23, 2015

(86) PCT No.: PCT/JP2015/070971
§ 371 (c)(1),
(2) Date: Dec. 27, 2016

(87) PCT Pub. No.: WO2016/017523
PCT Pub. Date: Feb. 4, 2016

(65) Prior Publication Data
US 2017/0148718 A1 May 25, 2017

(30) Foreign Application Priority Data
Jul. 29, 2014 (JP) ................. 2014-153951

(51) Int. Cl.
*H01L 23/498* (2006.01)
*H01L 23/00* (2006.01)

(52) U.S. Cl.
CPC .. *H01L 23/49838* (2013.01); *H01L 23/49827* (2013.01); *H01L 23/49866* (2013.01);
(Continued)

(58) Field of Classification Search
CPC ........ H05K 3/4602; H05K 2201/09754; H01L 2924/01079; H01L 2224/45144; H01L 2224/85444; H01L 2224/85455; H01L 2924/00012; H01L 2924/014; H01L 23/5384; H01L 2224/48091; H01L 2224/16227; H01L 23/49838; H01L 23/49866; H01L 2924/1515; H01L 2924/15738; H01L 2924/01028; H01L 24/32; H01L 24/48; H01L 2224/13144; H01L 2224/73265; H01L 2224/73257; H01L 23/5383; H01L 2224/32225;
(Continued)

(56) References Cited

FOREIGN PATENT DOCUMENTS

JP   2002-158509 A    5/2002
WO   2012144115    * 10/2012 ........... H05K 3/0029

OTHER PUBLICATIONS

International Search Report, PCT/JP2015/070971, dated Sep. 15, 2015, 1 pg.

* cited by examiner

*Primary Examiner* — Jasmine Clark
(74) *Attorney, Agent, or Firm* — Volpe and Koenig, P.C.

(57) ABSTRACT

A wiring board according to the present invention includes: an insulating base including a main face, a side face, and a notch portion opened in the main face and the side face; and an inner-face electrode disposed on the inner face of the notch portion and to be connected to an external circuit board with solder therebetween. In such a wiring board, the inner-face electrode contains nickel and gold at a surface portion thereof, more nickel than gold at a surface in an outer periphery section, and more gold than nickel at a surface in an inner region.

8 Claims, 14 Drawing Sheets

(52) U.S. Cl.
CPC .............. *H01L 24/32* (2013.01); *H01L 24/48* (2013.01); *H01L 2224/13144* (2013.01); *H01L 2224/16227* (2013.01); *H01L 2224/32225* (2013.01); *H01L 2224/48091* (2013.01); *H01L 2224/48106* (2013.01); *H01L 2224/48157* (2013.01); *H01L 2224/73257* (2013.01); *H01L 2224/73265* (2013.01); *H01L 2924/01028* (2013.01); *H01L 2924/01079* (2013.01); *H01L 2924/1515* (2013.01); *H01L 2924/15738* (2013.01)

(58) Field of Classification Search
CPC ..... H01L 2224/16225; H01L 23/49827; H01L 2224/05644; H01L 2224/05144
See application file for complete search history.

WIRING BOARD, ELECTRONIC DEVICE, AND ELECTRONIC MODULE

TECHNICAL FIELD

The present invention relates to a wiring board, an electronic device, and an electronic module.

BACKGROUND ART

Some of the conventional wiring boards each include a wiring conductor disposed in and on an insulating base, a notch portion extending from a side face to the bottom face of the insulating base, and an inner-face electrode disposed on the inner face of the notch portion and to be connected to the wiring conductor. In a case where an electronic device including an electronic component and such a wiring board is bonded, for example, to a module board by solder, the inner-face electrode is bonded to the module board with the solder therebetween (Japanese Unexamined Patent Publication JP-A 2002-158509).

SUMMARY OF INVENTION

Technical Problem

In recent years, increases in the precision of wiring boards has led to wiring conductors and the like being formed on the surfaces of insulating bases through a thin film method. However, when an inner-face electrode is formed on the inner face of the notch portion through the thin film method, the inner-face electrode disposed on the inner face of the notch portion tends to have less adhesiveness than that of a wiring conductor disposed on the surface of the insulating base. As such, if, when the inner-face electrode of the wiring board is bonded to a connection pad of the module board by solder, the solder adheres to an outer periphery section of the inner-face electrode, there is a concern that stress produced by a difference in thermal expansion between the wiring board and the module board will act on the outer periphery section of the inner-face electrode via the solder and cause the inner-face electrode to peel off from the insulating base.

Solution to Problem

According to one aspect of the present invention, a wiring board includes an insulating base including a main face, a side face, and a notch portion opened in the main face and the side face, and an inner-face electrode disposed on the inner face of the notch portion and to be connected to an external circuit board with solder therebetween. The inner-face electrode contains nickel and gold at a surface portion thereof, more nickel than gold at the surface in an outer periphery section, and more gold than nickel at the surface in an inner region.

According to another aspect of the present invention, an electronic device includes the above-described wiring board, and an electronic component mounted on the wiring board and electrically connected to the inner-face electrode.

According to another aspect of the present invention, an electronic module includes a module board including a connection pad on a main face thereof, and the above-described electronic device in which the inner-face electrode is connected to the connection pad with solder therebetween.

Advantageous Effects of Invention

The wiring board according to one aspect of the present invention includes the insulating base including the main face, the side face, and the notch portion opened in the main face and the side face, and the inner-face electrode disposed on the inner face of the notch portion and to be connected to an external circuit board with solder therebetween. The inner-face electrode contains nickel and gold at a surface portion thereof, more nickel than gold at the surface in the outer periphery section, more gold than nickel at the surface in the inner area, which prevents the solder from adhering to the outer periphery section of the inner-face electrode. This prevents stress produced by a difference in thermal expansion between the wiring board and the external circuit board from acting on the outer periphery section of the inner-face electrode via the solder and reduces the likelihood of the inner-face electrode peeling off from the insulating base. This in turn allows the wiring board to be small, highly precise, and highly reliable in terms of electrical connection with the external circuit board over long periods of time.

According to another aspect of the present invention, the electronic device includes the above-described wiring board, and the electronic component mounted on the wiring board and electrically connected to the inner-face electrode, which improves electrical reliability.

According to another aspect of the present invention, the electronic module includes the module board including a connection pad on the main face thereof, and the above-described electronic device in which the inner-face electrode is connected to the connection pad with solder therebetween, which results in the electronic module being highly reliable in terms of electrical connection between the wiring board and the module board over long periods of time.

DESCRIPTION OF EMBODIMENTS

Figure 1A:
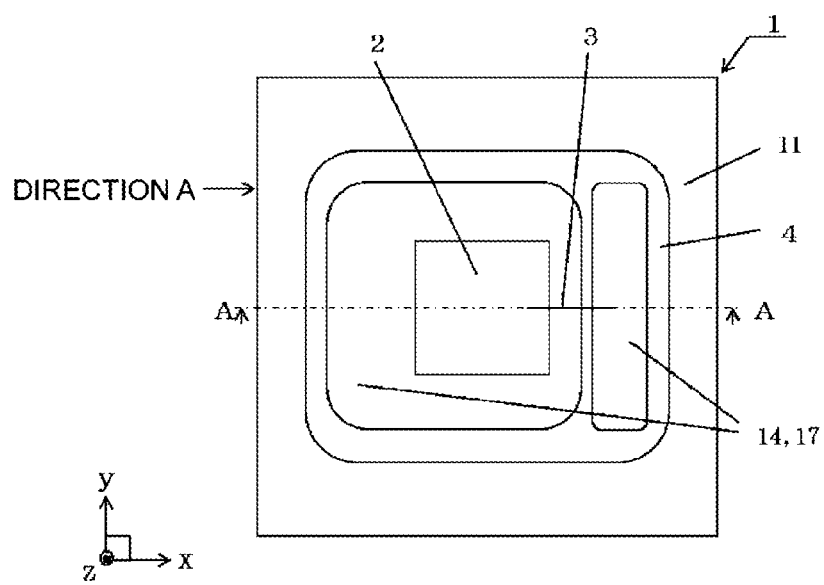
FIG. 1A is a top view of an electronic device according to a first embodiment of the present invention.
Figure 1B:
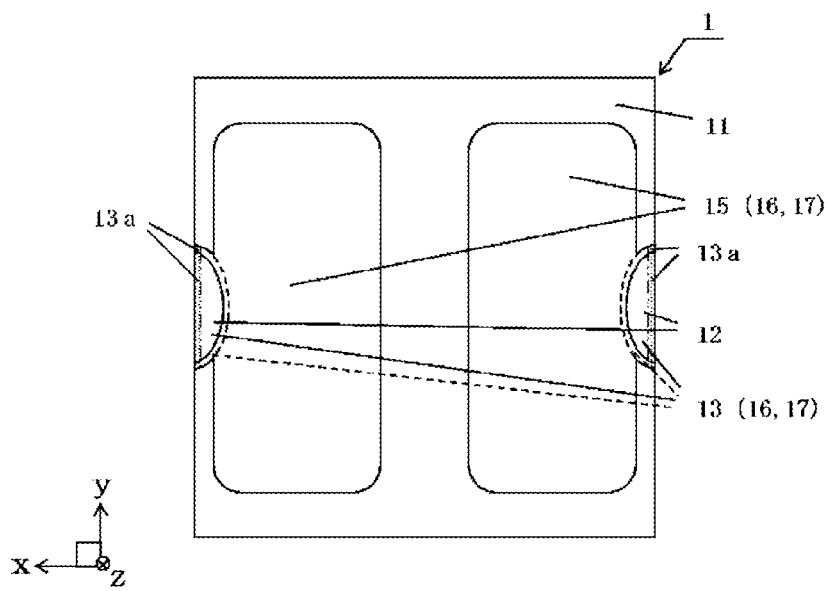
FIG. 1B is a bottom view of FIG. 1A.
Figure 2A:
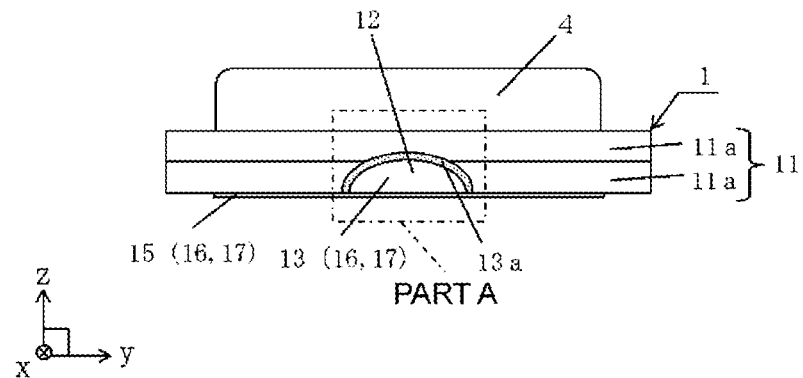
FIG. 2A is a side view of FIG. 1A viewed from the direction A.
Figure 2B:
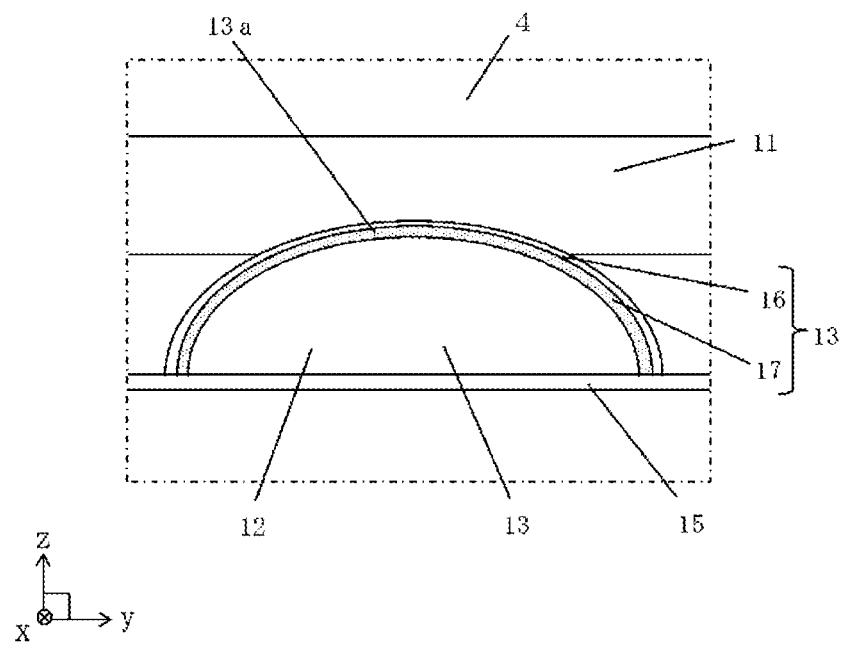
FIG. 2B is an enlarged side view of main parts in the part A of FIG. 2A.
Figure 3A:
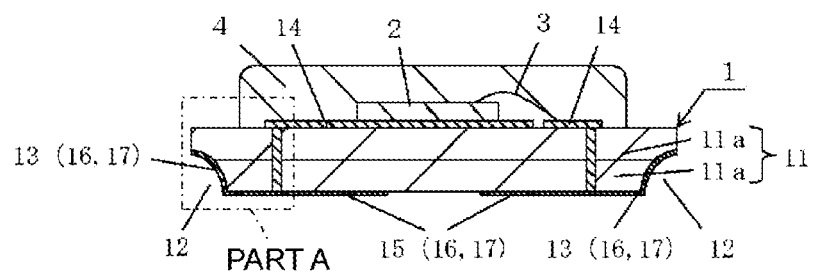
FIG. 3A is a cross-sectional view of the electronic device taken along the line A-A illustrated in FIG. 1A.
Figure 3B:
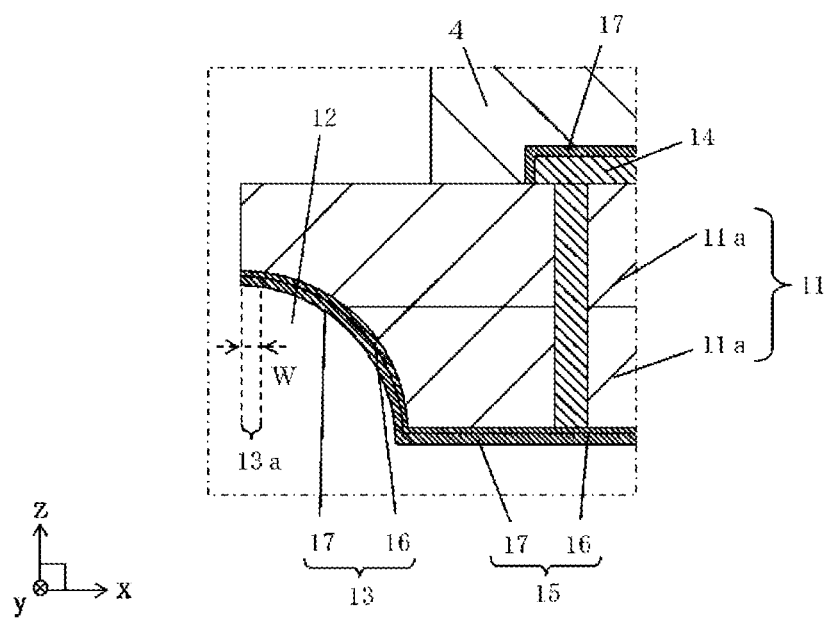
FIG. 3B is an enlarged cross-sectional view of main parts in the part A of FIG. 3A.

Several embodiments of the present invention will be described as examples with reference to the accompanying drawings.

First Embodiment

An electronic device according to a first embodiment of the present invention includes a wiring board 1 and an electronic component 2 mounted on the top face of the wiring board 1, as illustrated in FIGS. 1A to 3B and FIG. 6. For example, in a case where the electronic device constitutes a part of an electronic module as in the example illustrated in FIG. 6, the electronic device is connected by solder 6 to the top of a module board 5 including an external circuit board 5a.

The wiring board 1 includes: an insulating base 11 including a main face, a side face, and a notch portion 12 opened in the main face and the side face; and an inner-face electrode 13 disposed on the inner face of the notch portion 12 and to be connected to the external circuit board 5a included in the module board 5 with the solder 6 therebetween. The inner-face electrode 13 contains nickel and gold at a surface portion thereof, more nickel than gold at the surface in an outer periphery section 13a, and more gold than nickel at the surface in an inner area. In FIGS. 1A to 3B and 6, the electronic device is mounted on an X-Y plane in a virtual X-Y-Z space. In FIGS. 1A to 3B and 6, an upward direction is a positive direction along a virtual Z axis.

The insulating base 11 is formed of one or a plurality of insulating layers 11a. The insulating base 11 has a top face that includes a mounting area for the electronic component 2 and has a rectangular-plate shape in plan view, that is, viewed from the upward direction perpendicular to the top face. The insulating base 11 functions as a support body for supporting the electronic component 2. The electronic component 2 is bonded and fixed to the mounting area at a central portion of the top face of the insulating base 11 with a bonding member therebetween, such as a low-melting point brazing material or a conductive resin.

The insulating base 11 may, for example, be made from ceramic, such as an aluminum oxide-based sintered body (i.e., alumina ceramic), an aluminum nitride-based sintered body, a mullite-based sintered body, or a glass ceramic sintered body.

In a case where the insulating base 11 is made from an aluminum oxide-based sintered body, for example, the insulating base 11 is manufactured as follows. A suitable organic binder, solvent, and the like are added to and mixed with raw material powders of aluminum oxide, silicon oxide, magnesium oxide, calcium oxide, and the like to produce a slurry. The slurry is formed into a sheet by a doctor blade method, a calendar roll method, or the like to obtain a ceramic green sheet. Thereafter, suitable punching processing is applied to the ceramic green sheet, and a plurality of the ceramic green sheets are then laminated and fired at a high temperature (e.g., 1,600° C.).

The notch portion 12 is opened in a main face and a side face of the insulating base 11. As illustrated in FIGS. 1A to 3B and 6, the notch portion 12 is opened in two directions, namely, in a bottom-side main face (bottom face) and a side face of the insulating base 11. Alternatively, the notch portion 12 may be opened in three directions, namely in a top-side main face (top face), the bottom-side main face (bottom face), and a side face of the insulating base 11. In the example illustrated in FIGS. 1A to 3B, the notch portion 12 has a semi-elliptical shape in plan view. Specifically, the notch portion 12 has a shape corresponding to a portion obtained by dividing an ellipsoid, which results in the inner face of the notch portion 12 being a curved surface. The notch portion 12 may have a shape corresponding to a portion obtained by dividing a hemisphere having a semi-circle or semi-oval shape in plan view. This notch portion 12 is provided by forming a hole that will serve as the notch portion 12 in the insulating base 11 through blasting or the like. This method results in the inner face of the notch portion 12 being a curved surface. Alternatively, the notch portion 12 may have a shape corresponding to a portion obtained by dividing a pillar or a frustum having a rectangular shape whose corner portions have a circular arc shape in plan view, or may have a semicircle, semi-ellipse, or semi-oval shape in plan view, or may have a shape corresponding to a portion obtained by dividing a pillar or frustum in which notch portions 12 of different sizes have been overlaid on each other. This notch portion 12 is formed in several ceramic green sheets for use in the insulating base 11 by forming a through-hole that will serve as the notch portion 12 through laser processing, punching processing using a die, or the like.

The inner-face electrode 13 is disposed on the inner face of the notch portion 12, and a wiring conductor 14 is disposed on and in the insulating base 11. In the example illustrated in FIGS. 1A to 3B, the inner-face electrode 13 is disposed on the entire inner face of the notch portion 12. In the example illustrated in FIGS. 1A to 3B, a main-face electrode 15 connected to the inner-face electrode 13 is disposed on the main face where the notch portion 12 is opened. The inner-face electrode 13 and the main-face electrode 15 collectively form an external electrode. The wiring conductor 14 and the main-face electrode 15 are connected at the bottom face of the insulating base 11. The inner-face electrode 13 and the wiring conductor 14 are electrically connected with the main-face electrode 15 therebetween.

The external electrode that includes the inner-face electrode 13 and the main-face electrode 15 is for bonding the wiring board 1 to the module board 5 including the external circuit board 5a. The inner-face electrode 13, the wiring conductor 14, and the main-face electrode 15 are for electrically connecting the electronic component 2 mounted on the wiring board 1 to the module board 5. The wiring conductor 14 includes a wiring conductor disposed on or in the insulating base 11, and a through conductor that passes through the insulating layer 11a constituting the insulating base 11 to electrically connect upper and lower wiring conductors.

The inner-face electrode 13 or the main-face electrode 15 includes a thin film layer 16 and a plating layer 17. The thin film layer 16 includes, for example, a contact metal layer and a barrier layer. The contact metal layer constituting a part of the thin film layer 16 is formed on the main face of the insulating base 11 and the inner face of the notch portion 12. The contact metal layer is made from tantalum nitride, nickel-chromium, nickel-chromium-silicon, tungsten-silicon, molybdenum-silicon, tungsten, molybdenum, titanium, chromium, or the like, and is deposited on the surface of the insulating base 11 and on the inner face of the notch portion 12 through a thin film formation technique such as vapor deposition method, ion plating method, or sputtering method. For example, the contact metal layer is formed through vacuum vapor deposition as follows: placing the insulating base 11 in the film deposition chamber of a vacuum vapor deposition device; disposing a metal piece that will become the contact metal layer at a vapor deposition source within the film deposition chamber; putting the film deposition chamber in a vacuum (a pressure of no higher than $10^{-2}$ Pa); heating the metal piece disposed at the vapor deposition source to vaporize the metal piece and causing the molecules of the vaporized metal piece to deposit on the insulating base 11, which forms a thin film metal layer that will become the contact metal layer; forming a resist pattern by photolithography method on the insulating base 11 on which the thin film metal layer has been formed; and removing an excess portion of the thin film metal layer by etching, thereby forming the contact metal layer. The barrier layer is then deposited on the top face of the contact metal layer. The barrier layer has superior properties and wettability with respect to the contact metal layer and the plating layer, and serves to strongly bond the contact metal layer and the plating layer to each other and to prevent mutual diffusion between the contact metal layer and the plating layer. The barrier layer is made from, for example, nickel-chromium, platinum, palladium, nickel, cobalt, or the like, and is deposited on the contact metal layer through a thin film formation technique such as vapor deposition method, ion plating method, or sputtering method.

Preferably, the contact metal layer is approximately from 0.01 to 0.5 μm thick. A thickness less than 0.01 μm tends to make the contact metal layer difficult to strongly adhere to the insulating base 11. A thickness greater than 0.5 μm tends to cause the contact metal layer to peel off due to internal stress produced in the formation of the contact metal layer. Preferably, the barrier layer is approximately from 0.05 to 1 μm thick. A thickness less than 0.05 μm tends to generate a flaw such as a pinhole in the barrier layer, which tends to make it difficult for the layer to function as a barrier layer. A thickness greater than 1 μm tends to cause the barrier layer to peel off due to internal stress produced in the formation of the barrier layer.

The plating layer 17 is deposited on the thin film layer 16 through electroplating or electroless plating. The plating layer 17 is made from a metal, such as nickel, copper, gold, or silver, that has superior corrosion resistance and connectivity with a connecting member. For example, a nickel plating layer approximately from 0.5 to 5 μm thick and a gold plating layer approximately from 0.1 to 3 μm thick are deposited in that order. This can effectively prevent the inner-face electrode 13 and the main-face electrode 15 from being corroded and can achieve a strong bond between the inner-face electrode 13 and main-face electrode 15, and a connection pad 51 that is formed for the purpose of connection on the module board 5.

The wiring conductor 14 may be made from a metal material such as tungsten (W), molybdenum (Mo), manganese (Mn), silver (Ag), or copper (Cu). For example, in a case where the insulating base 11 is made from an aluminum oxide-based sintered body, the wiring conductor 14 is formed as follows: printing and applying a conductor paste, obtained by adding and mixing a suitable organic binder, solvent, and the like to and with a high-melting point metal powder of tungsten, molybdenum, manganese, or the like, to the ceramic green sheet that will become the insulating base 11 in a predetermined pattern through screen printing in advance; and firing the conductor paste together with the ceramic green sheet that will become the insulating base 11, thereby forming the wiring conductor 14 deposited at a predetermined position on the insulating base 11. In a case where the wiring conductor 14 is a through conductor, the wiring conductor 14 is formed as follows: forming a through hole in the green sheet through laser processing or punching processing using a die or punching; and filling the through-hole with a conductor paste for the wiring conductor 14 using a printing method, thereby forming the wiring conductor 14.

Note that the plating layer 17 is deposited through electroplating or electroless plating on an exposed surface of the wiring conductor 14, in the same manner as the thin film layer 16 of the inner-face electrode 13 and the thin film layer 16 of the main-face electrode 15. The plating layer 17 is made from a metal, such as nickel, copper, gold, or silver, that has superior corrosion resistance and connectivity with a connecting member. For example, a nickel plating layer approximately from 0.5 to 5 μm thick and a gold plating layer approximately from 0.1 to 3 μm thick, or a nickel plating layer approximately from 1 to 10 μm thick and a silver plating layer approximately from 0.1 to 1 μm thick are deposited in that order. This can effectively prevent the wiring conductor 14 from being corroded, and this can achieve a strong adhesion between the wiring conductor 14 and the electronic component 2 and a strong bond between the wiring conductor 14 and a connecting member 3 such as a bonding wire.

The inner-face electrode 13 contains nickel and gold at a surface portion thereof, more nickel than gold at the surface in the outer periphery section 13a, and more gold than nickel at the surface in the inner region. Here, the outer periphery section 13a of the inner-face electrode 13 refers to an outer periphery section of the inner-face electrode 13 located adjacent to a side face of the insulating base 11. The surface of the inner-face electrode 13 in the outer periphery section contains no less than 50% nickel, and the surface of the inner-face electrode 13 in the inner region contains no less than 50% gold. Note that the nickel or gold content at the surfaces of the inner-face electrode 13 in the outer periphery section and in the inner region, or distribution of the nickel and gold at the surfaces may be measured with an electron probe microanalyzer. In the example illustrated in FIGS. 1A to 3B, the outer periphery section 13a of the inner-face electrode 13 is disposed along the opening of the notch portion 12 located adjacent to a side face of the insulating base 11, in an outer periphery section of the inner-face electrode 13 located adjacent to the side face of the insulating base 11. The outer periphery section 13a of the inner-face electrode 13 is hatched in FIGS. 1B to 2B. Making a width W of the outer periphery section 13a of the inner-face electrode 13 satisfy approximately 0.01 mm≤W≤0.2 mm can achieve a wiring board 1 that is small, highly precise, and highly reliable in terms of electrical connection with the module board 5 including the external circuit board 5a over long periods of time.

This outer periphery section 13a of the inner-face electrode 13 can be formed by applying heat locally to the outer periphery section of the inner-face electrode 13 located adjacent to a side face of the insulating base 11. For example, laser irradiation may be used to apply heat to the outer periphery section of the inner-face electrode 13, which includes the thin film layer 16 and the plating layer 17, located adjacent to a side face of the insulating base 11, the heat being applied to a degree that does not remove the inner-face electrode 13, such that the outer periphery section of the inner-face electrode 13 located adjacent to the side face of the insulating base 11 is altered. For example, in a case where the plating layer 17 of the inner-face electrode 13 is formed of two layers, namely, a Ni plating layer and an Au plating layer, applying heat to the outer periphery section of the inner-face electrode 13 located adjacent to a side face of the insulating base 11 through laser irradiation causes the Ni plating layer to diffuse into the Au plating layer and precipitate on the surface of the Au plating layer, or in other words, provides a constituent (Ni) having low wettability with respect to the solder 6 on the surface of the plating layer 17. Accordingly, a portion that has low wettability with respect to the solder 6 can be formed in the outer periphery section 13a of the inner-face electrode 13, and suppressing the heat application to the inner side of the inner-face electrode 13 and the main-face electrode 15 can keep them highly wettable with respect to the solder 6. Note that more gold than nickel being present at the surface in the inner region of the inner-face electrode 13 also means substantially no nickel being present at the surface in the inner region of the inner-face electrode 13 as a result of no heat being applied to the inner region of the inner-face electrode 13 through laser irradiation.

Such local heat application to the wiring board 1 can suppress alteration due to heat reaching the inner-face electrode 13, the wiring conductor 14, the main-face electrode 15, and the like. This in turn allows the wiring board 1 to have good adhesion between the wiring conductor 14 and the electronic component 2, a good bond between the wiring conductor 14 and the connecting member 3 such as a bonding wire, and a good bond between the inner-face electrode 13 and main-face electrode 15, and the connection pad 51 formed on the module board 5 including the external circuit board 5a.

In a case where the plating layer 17 of the inner-face electrode 13 is formed of two layers, namely, a Ni plating layer and an Au plating layer, as described above, a constituent (Ni), which has low wettability with respect to the solder 6, more than a constituent (Au), which has high wettability with respect to the solder 6, being present at the surface in the outer periphery section 13a of the inner-face electrode 13 can effectively make the surface low wettable with respect to the solder 6. This in turn makes it possible to effectively prevent stress produced by a difference in thermal expansion between the wiring board 1 and the module board 5 from acting on the outer periphery section 13a of the inner-face electrode 13 via the solder 6 and to reduce the likelihood of the inner-face electrode 13 peeling off from the insulating base 11. The surface in the outer periphery section 13a of the inner-face electrode 13 having more of the constituent having low wettability with respect to the solder 6 than the constituent having high wettability with respect to the solder 6 can be confirmed by, for example, using an electron probe microanalyzer to measure a distribution of the constituent having high wettability with respect to the solder 6 and the constituent having low wettability with respect to the solder at an observation location.

Although the outer periphery section 13a of the inner-face electrode 13 may be disposed away from the opening of the notch portion 12 located adjacent to a side face of the insulating base 11, disposing the outer periphery section 13a along the opening of the notch portion 12 adjacent to the side face makes it possible to prevent a highly wettable portion from being present in the outer periphery section 13a of the inner-face electrode 13a and to broaden the inner region of the inner-face electrode 13a. This in turn allows the wiring board 1 to have a good bond between the inner-face electrode 13 and main-face electrode 15, and the connection pad 51 formed on the module board 5 including the external circuit board 5a.

The wiring board 1 includes the insulating base 11 including the notch portion 12 opened in two directions, namely, in a main face and in a side face thereof, and the inner-face electrode 13 disposed on the inner face of the notch portion 12 and to be connected to the external circuit board 5a with the solder 6 therebetween. The inner-face electrode 13 contains nickel and gold at a surface portion thereof, more nickel than gold at the surface in the outer periphery section 13a, and more gold than nickel at the surface in the inner region, which prevents the solder 6 from being present in the outer periphery section 13a of the inner-face electrode 13. This prevents stress produced by a difference in thermal expansion between the wiring board 1 and the external circuit board 5a from acting on the outer periphery section 13a of the inner-face electrode 13 via the solder 6 and reduces the likelihood of the inner-face electrode 13 peeling off from the insulating base 11. This in turn allows the wiring board 1 to be small, highly precise, and highly reliable in terms of electrical connection with the external circuit board 5a over long periods of time.

In the example illustrated in FIGS. 1A to 3B, the wiring conductor 14 and the main-face electrode 15 are connected at the main face (the bottom face) of the insulating base 11. In the example illustrated in FIG. 4A, the inner-face electrode 13 and the wiring conductor 14 are connected at a portion of the inner-face electrode 13, on the inner face of the notch portion 12 on the side opposite from the main face (bottom face) of the insulating base 11, and the wiring conductor 14 and the main-face electrode 15 are connected via the inner-face electrode 13. In the example illustrated in FIG. 4B, the inner-face electrode 13 and the wiring conductor 14 are connected at the inner face of the notch portion 12, and the wiring conductor 14 and the main-face electrode 15 are connected via the inner-face electrode 13 on the inner face of the notch portion 12 and directly at the main face (bottom face) of the insulating base 11. In the case where the wiring conductor 14 is connected to the main-face electrode 15, the main-face electrode 15 can strongly adhere to the main face of the insulating base 11, and thus a better electrical connection can be made between the wiring board 1 on which the electronic component 2 is mounted and the module board 5 including the external circuit board 5a than in the case where the inner-face electrode 13 and the wiring conductor 14 are connected at the inner face of the notch portion 12.

The wiring board 1 according to the first embodiment of the present invention can, for example, be manufactured through the following manufacturing method.

Figure 5A:
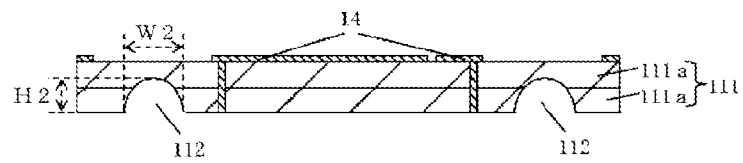
FIGS. 5A to 5D are cross-sectional views of a wiring board according to the first embodiment of the present invention, illustrating a method for manufacturing the wiring board.

First, as in the example illustrated in FIG. 5A, prepared is a mother insulating base 111 formed of a plurality of insulating layers 111a that have the wiring conductor 14 formed therein and thereon. The mother insulating base 111 has a shape in which a plurality of insulating bases 11 are connected together, such as a shape of a multipiece wiring board, and has a hemispheric recessed portion 112, which will become the notch portion 12, opened in the bottom-side main face. Such a recessed portion 112 is formed through blasting or the like as described above.

Figure 5B:
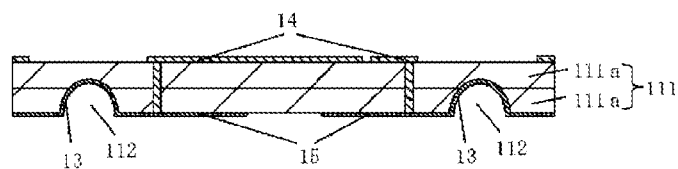

Next, as in the example illustrated in FIG. 5B, the inner-face electrode 13 including the thin film layer 16 and the plating layer 17 is formed on the inner face of the recessed portion 112 that will become the notch portion 12 of the mother insulating base 111. Then, the main-face electrode 15 including the thin film layer 16 and the plating layer 17 is formed on the surface of the mother insulating base 111.

Figure 5C:
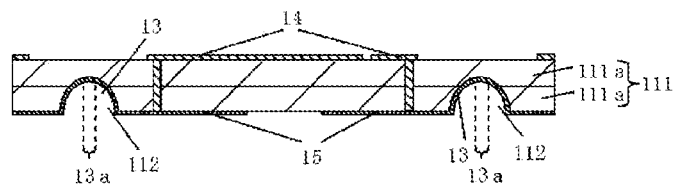

Next, as in the example illustrated in FIG. 5C, heat is applied to a predetermined region of the inner-face electrode 13 on the inner face of the recessed portion 112 through laser irradiation, and a portion having low wettability with respect to the solder 6 (a portion containing gold and nickel) is formed on the surface of the inner-face electrode 13 along what will be the outer edge of the wiring board 1.

Figure 5D:
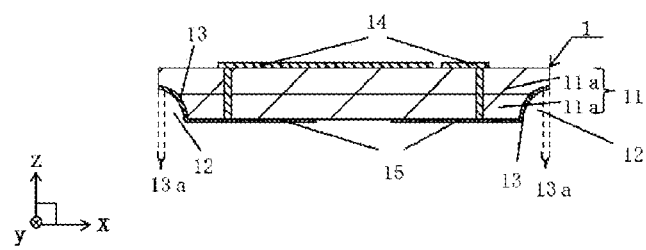

Thereafter, as in the example illustrated in FIG. 5D, the recessed portion 112 is cut through, for example, a slicing method. These processes make it possible to manufacture the wiring board 1 including the inner-face electrode 13 containing more nickel than gold at the surface in the outer periphery section 13a and more gold than nickel at the surface in the inner region.

Note that as in the example illustrated in FIG. 5A, ensuring that a width W2 of the recessed portion 112 is no less than a depth H2 of the recessed portion 112 (that is, W2≥H2) makes it easy to favorably form the inner-face electrode 13 and the outer periphery section 13a of the inner-face electrode 13 (that is, the portion having low wettability with respect to the solder 6) on the inner face of the recessed portion 112.

Additionally, at the surface in the outer periphery section 13a of the inner-face electrode 13 formed on the inner face of the recessed portion 112, the portion having low wettability with respect to the solder 6 is formed so as to be broader than the width of a blade used to cut the recessed portion 112 through a slicing method, specifically to be no less than 110% the width of the blade. This makes it possible to favorably manufacture the wiring board 1 such that the surface in the outer periphery section 13a of the inner-face electrode 13 along the edge of the opening contain more nickel than gold and thus have low wettability with respect to the solder 6 and the surface in the inner region contain more gold than nickel and thus have high wettability with respect to the solder 6.

Note that the wiring board 1 may be manufactured as follows: forming a row of a plurality of portions having low wettability with respect to the solder 6 in the inner-face electrode 13 formed on the inner face of the recessed portion 112; and cutting the recessed portion 112. This causes the surfaces at the plurality of portions in a row including the surface in the outer periphery section 13a of the inner-face electrode 13 to contain more nickel than gold and thus have low wettability with respect to the solder 6 and causes the surfaces in the inner region other than the surfaces at the plurality of portions in a row to contain more gold than nickel and thus have high wettability with respect to the solder 6.

The above-described manufacturing method makes it possible to manufacture the wiring board 1 having a good electrical connection with the electronic component 2 and with the module board 5 including the external circuit board 5a, with a high level of productivity.

Even if the thin film layer 16 and the plating layer 17 of the inner-face electrode 13 are exposed on a side face of the insulating base 11 as a result of the recessed portion 112 being cut, as in the example illustrated in FIGS. 1A to 3B, ensuring that the surface in the outer periphery section 13a of the inner-face electrode 13 contain more nickel than gold and thus have low wettability with respect to the solder 6 makes it possible to prevent the solder 6 from flowing to an end portion where the thin film layer 16 of the inner-face electrode 13 is exposed.

Figure 4A:
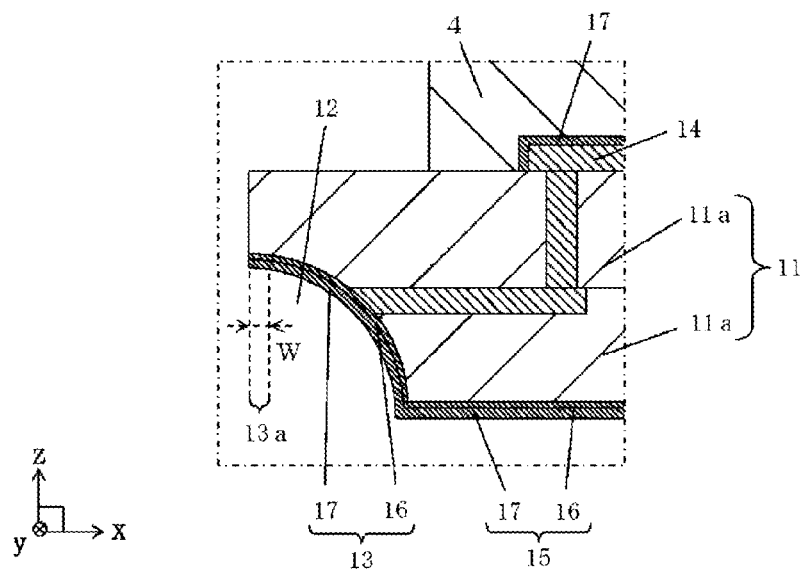
FIGS. 4A and 4B are enlarged cross-sectional views of main parts of another example of the electronic device according to the first embodiment of the present invention.
Figure 4B:
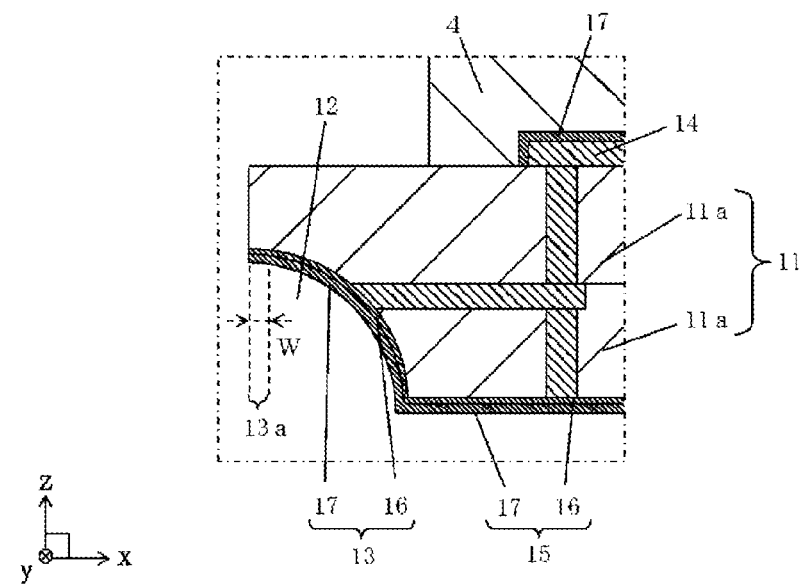

A method for connecting the inner-face electrode 13 and the wiring conductor 14 at the inner face of the notch portion 12 as in the examples illustrated in FIGS. 4A and 4B may be as follows: forming the wiring conductor 14 in a region that overlaps, in plan view, with the recessed portion 112 in the mother insulating base 111; exposing the wiring conductor 14 to the recessed portion 112 through blasting or the like; and forming the inner-face electrode 13 on the inner face of the recessed portion 112 to connect the inner-face electrode 13 and the wiring conductor 14.

Note that, after the recessed portion 112 is cut, the outer periphery section 13a of the inner-face electrode 13 disposed on the inner face of the notch portion 12 may be heated through laser irradiation so as to have low wettability with respect to the solder 6. In this case, the outer periphery section 13a of the inner-face electrode 13 can be irradiated with a laser from the lateral direction of the insulating base 11 after the insulating base 11 is divided. Accordingly, in a case where the notch portion 12 is small or the like, it is easy to precisely form the inner-face electrode 13 in which the surface in the outer periphery section 13a contain more nickel than gold and thus have low wettability with respect to the solder 6, which makes it possible to manufacture the wiring board 1 that is smaller and has a good electrical connection with the electronic component 2 and the module board 5.

An electronic device can be manufactured by disposing the electronic component 2 on the top face of the wiring board 1. The electronic component 2 mounted on the wiring board 1 is a semiconductor element such as an IC chip or an LSI chip, a light-emitting element, a piezoelectric element such as a crystal resonator or a piezoelectric oscillator, various types of sensors, or the like. For example, in a case where the electronic component 2 is a wire-bonding semiconductor element, the semiconductor element is fixed on the wiring conductor 14 with a bonding member such as a low-melting point brazing material or a conductive resin and then the electrode of the semiconductor element is electrically connected with the wiring conductor 14 with the connecting member 3 therebetween such as a bonding wire, which results in the semiconductor element being mounted on the wiring board 1. Additionally, for example, in a case where the electronic component 2 is a flip-chip semiconductor element, the electrode of the semiconductor element is electrically and mechanically connected with the wiring conductor 14 with the connecting member 3 therebetween, such as a solder bump, a gold bump, or a conductive resin (for example, an anisotropic conductive resin), which results in the semiconductor element being mounted on the wiring board 1. In addition, a plurality of the electronic components 2 may be mounted on the wiring board 1. Where necessary, a small electronic component such as a resistive element or a capacitive element may also be mounted. Furthermore, where necessary, the electronic component 2 may be sealed with, for example, a encapsulant 4 made from resin, glass, or the like, or a lid made from resin, glass, ceramics, metal, or the like.

Figure 6:
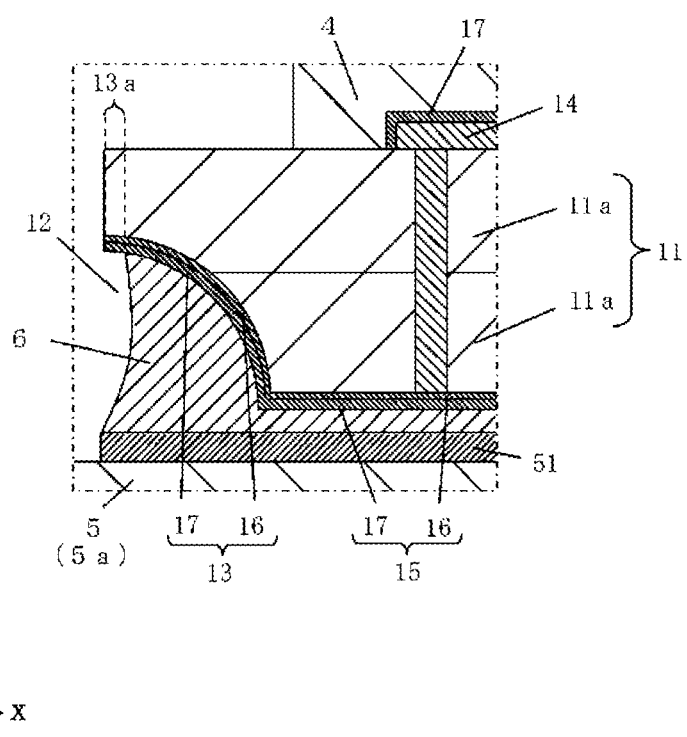
FIG. 6 is an enlarged cross-sectional view of main parts of an electronic module in which the electronic device illustrated in FIGS. 1A and 1B is mounted on a module board.
Figure 7A:
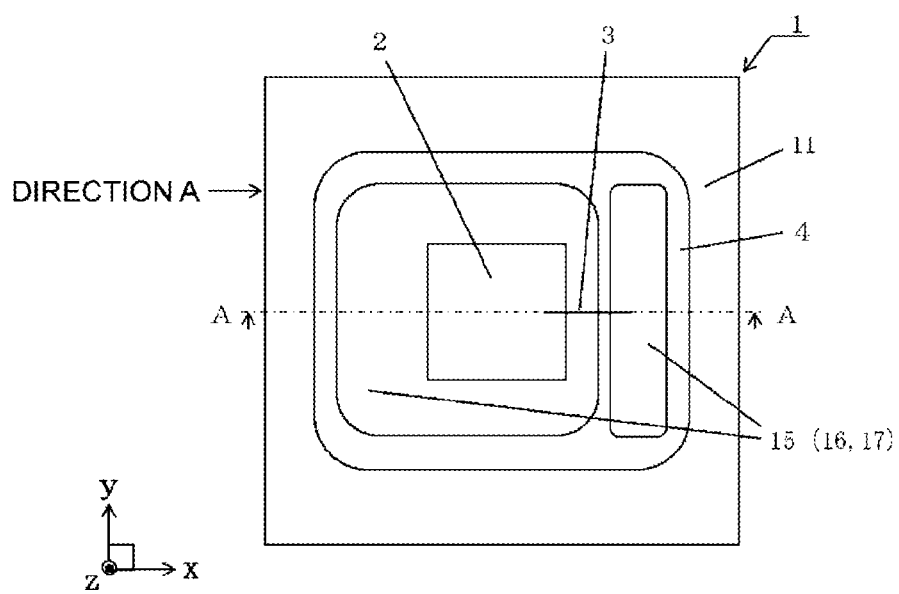
FIG. 7A is a top view of an electronic device according to a second embodiment of the present invention.
Figure 7B:
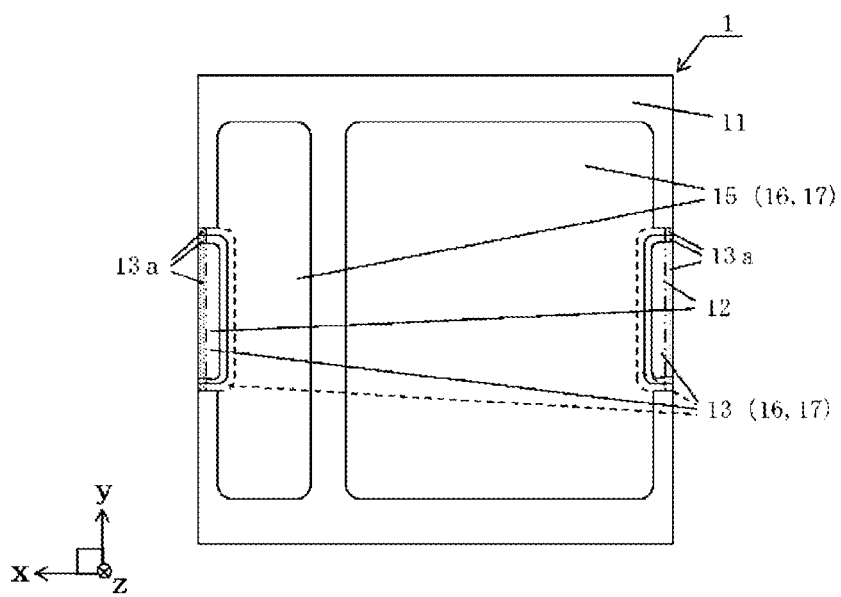
FIG. 7B is a bottom view of FIG. 7A.
Figure 8A:
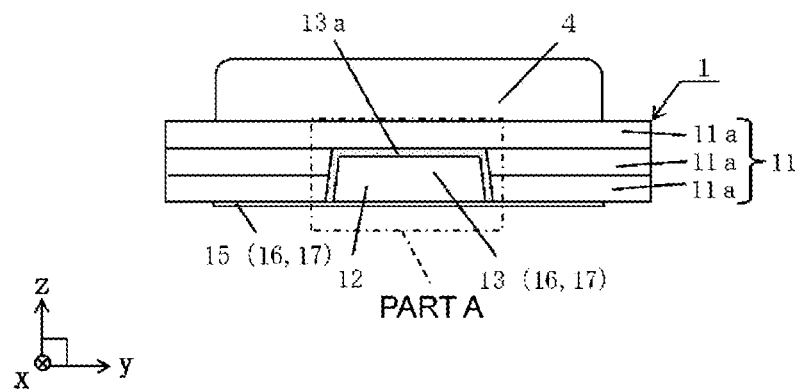
FIG. 8A is a side view of FIG. 7A viewed from the direction A.
Figure 8B:
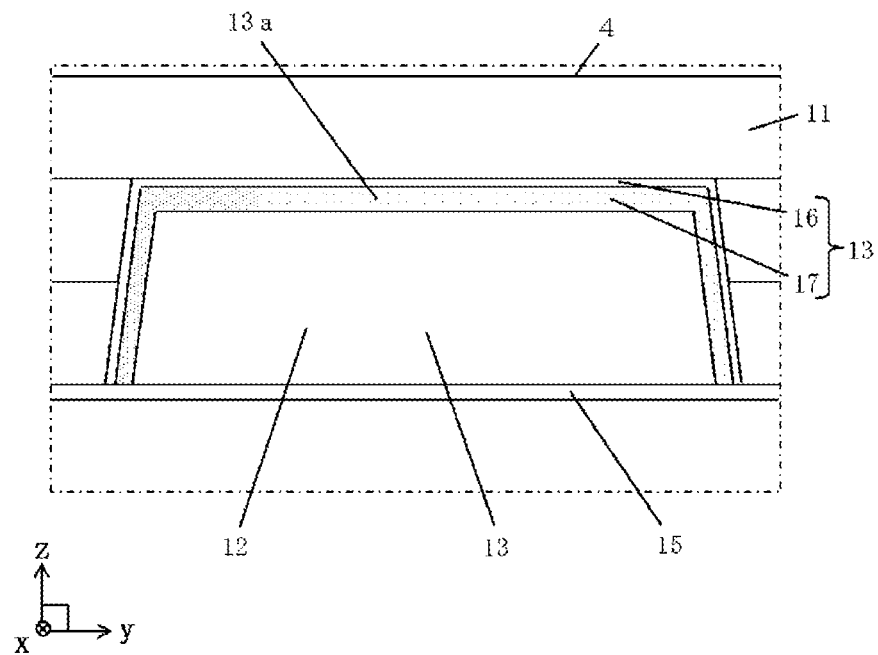
FIG. 8B is an enlarged side view of main parts in the part A of FIG. 8A.
Figure 9A:
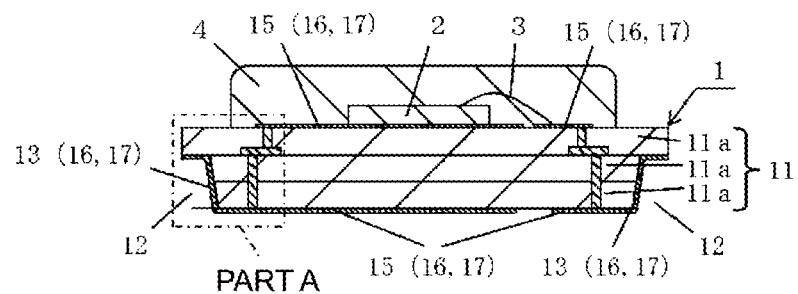
FIG. 9A is a cross-sectional view of the electronic device taken along the line A-A illustrated in FIG. 7A.
Figure 9B:
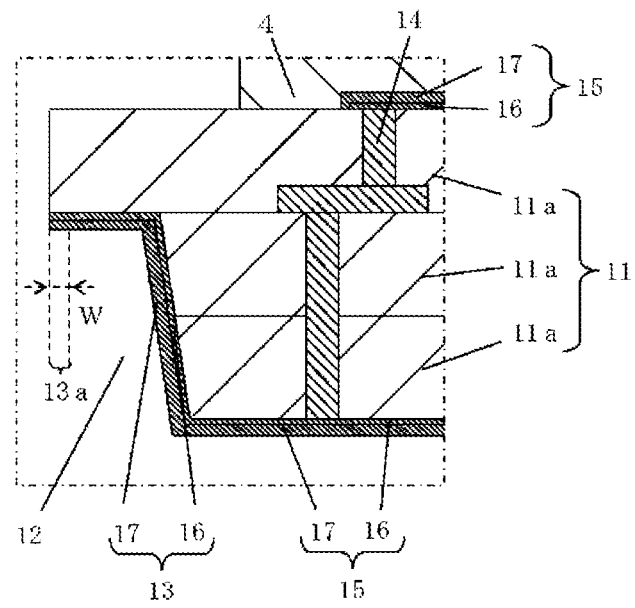
FIG. 9B is an enlarged cross-sectional view of main parts in the part A of FIG. 9A.
Figure 10:
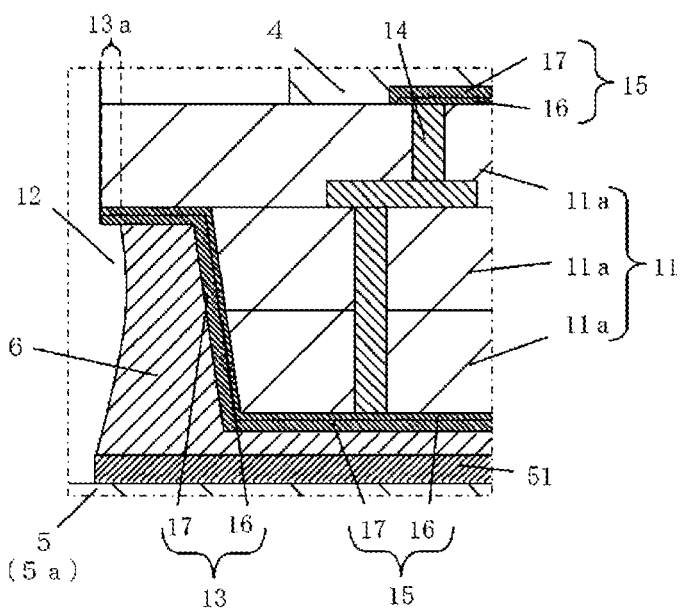
FIG. 10 is an enlarged cross-sectional view of main parts of an electronic module in which the electronic device illustrated in FIGS. 7A and 7B is mounted on a module board.

As in the example illustrated in FIG. 6, the electronic device according to the present embodiment is connected to the connection pad 51 of the module board 5 including the external circuit board 5a with the solder 6 therebetween, thus forming an electronic module. The solder 6 is bonded to the inner-face electrode 13 within the notch portion 12 and to the main-face electrode 17 on the bottom face of the insulating base 11. The solder 6 is spread, in a flared shape, from an end portion on the inner side of the inner-face electrode 13 not including the outer periphery section 13a of the inner-face electrode 13 to an end portion on an outer side of the connection pad 51 and is prevented from being formed in the outer periphery section 13a of the inner-face electrode 13 due to the characteristics of the surface in the outer periphery section 13a containing more nickel than gold. Such composition prevents stress produced by a difference in thermal expansion between the wiring board 1 and the module board 5 including the external circuit board 5a from acting on the outer periphery section 13a of the inner-face electrode 13 via the solder 6, which makes it possible to prevent the inner-face electrode 13 from peeling off from the insulating base 11. This ensures that the electronic device is strongly connected to the module board 5, resulting in an electronic module having improved connection reliability.

The wiring board according to the present embodiment includes: the insulating base 11 including the main face, the side face, and the notch portion 12 opened in the main face and the side face; and the inner-face electrode 13 disposed on the inner face of the notch portion 12 and to be connected to the external circuit board 5a with the solder 6 therebetween. The inner-face electrode 13 contains nickel and gold at a surface portion thereof, more nickel than gold at the surface in the outer periphery section 13a, and more gold than nickel at the surface in the inner region. This composition prevents the solder 6 from being formed in the outer periphery section 13a of the inner-face electrode 13, which prevents stress produced by a difference in thermal expansion between the wiring board 1 and the external circuit board 5a from acting on the outer periphery section 13a of the inner-face electrode 13 via the solder 6 and reduces the likelihood of the inner-face electrode 13 peeling off from the insulating base 11. This allows the wiring board 1 to be small, highly precise, and highly reliable in terms of electrical connection with the external circuit board 5a over long periods of time.

The wiring board 1 according to the present embodiment can be advantageously used in a small, high-output electronic device and can provide an excellent electrical connection therewith. For example, the wiring board 1 can be advantageously used as a small wiring board 1 for disposing a light-emitting element which is a high-luminous light-emitting element corresponding to the electronic component 2.

Additionally, the wiring board 1 can be formed of a single insulating layer 11a in which the notch portion 12 having a bottom can be formed, which allows the wiring board 1 to be thinner than the wiring board 1 according to a second embodiment described later.

Additionally, the curved inner face of the notch portion 12 allows laser irradiation to be easily applied to an area of the inner-face electrode 13 in the notch portion 12 that will become the outer periphery section 13a, allows a portion having low wettability with respect to the solder 6 to be favorably formed in the outer periphery section 13a of the inner-face electrode 13 on the inner face of the notch portion 12, and allows the solder 6 to be easily spread across the entire inner region of the inner-face electrode 13. This allows the wiring board 1 to be small, highly precise, and highly reliable in terms of electrical connection with the module board 5 over long periods of time.

The electronic device according to the present embodiment includes the above-described wiring board 1, which improves electrical reliability.

An electronic module according to another aspect of the present invention includes the module board 5 including the connection pad 51 on a main face thereof, and the above-described electronic device in which the inner-face electrode 13 is connected to the connection pad 51 with the solder 6 therebetween. This allows the electronic module to be highly reliable in terms of electrical connection between the wiring board 1 and the module board 5 over long periods of time.

Second Embodiment

An electronic device according to a second embodiment of the present invention will be described next with reference to FIGS. 7A to 10.

The electronic device according to the second embodiment of the present invention differs from the electronic device according to the first embodiment described above in that, as in the example illustrated in FIGS. 7A to 10, the notch portion 12 is formed into a rectangular shape whose corner portions have a circular arc shape in plan view and has a shape extending long along an outer edge of the insulating base 11 and corresponding to a portion obtained by dividing a truncated quadrangular pyramid, and the main-face electrode 15 is disposed on the top face of the insulating base 11.

Like the first embodiment, a wiring board according to the second embodiment of the present invention prevents the solder 6 from being formed in the outer periphery section 13a of the inner-face electrode 13, which prevents stress produced by a difference in thermal expansion between the wiring board 1 and the external circuit board 5a from acting on the outer periphery section 13a of the inner-face electrode 13 via the solder 6 and reduces the likelihood of the inner-face electrode 13 peeling off from the insulating base 11. This allows the wiring board 1 to be small, highly precise, and highly reliable in terms of electrical connection with the external circuit board 5a over long periods of time.

The main-face electrode 15 disposed on the top face of the insulating base 11 is used as wiring for disposing the electronic component 2 or for connecting the connecting member 3. The main-face electrode 15 disposed on the top face of the insulating base 11 allows the electronic component 2 to be precisely mounted on the wiring board 1. For example, in a case where a light-emitting element is mounted as the electronic component 2, precisely disposing the light-emitting element allows a light emitting device to emit light with precision.

Although the notch portion 12 may be formed into a shape corresponding to a portion obtained by dividing a pillar as in the example illustrated in FIG. 7A to 9B, forming the notch portion 12 into a shape corresponding to a portion obtained by dividing a truncated quadrangular pyramid in which the width of the opening of the notch portion 12 in the bottom face of the insulating base 11 is greater than the width of the bottom portion of the notch portion 12 makes it possible to favorably form the inner-face electrode 13 on the inner face of the notch portion 12 and the outer periphery section 13a of the inner-face electrodes 13 having low wettability with respect to the solder 6.

The notch portion 12 in the wiring board 1 according to the second embodiment is formed by forming a through-hole that will become the notch portion 12 in several ceramic green sheets for use in the insulating base 11 through laser processing, punching processing using a die, or the like as described above.

Additionally, as in the example illustrated in FIGS. 7A to 10, disposing the inner-face electrode 13 on the inner-side faces and bottom face of the notch portion 12 allows the wiring board 1 to be highly reliable in terms of electrical connection with the module board 5.

The wiring board 1 according to the second embodiment can be manufactured by using the same method as that of the first embodiment, with the exception of the method of forming the notch portion 12.

Third Embodiment

An electronic device according to a third embodiment of the present invention will be described next with reference to FIGS. 11A to 12.

Figure 11A:
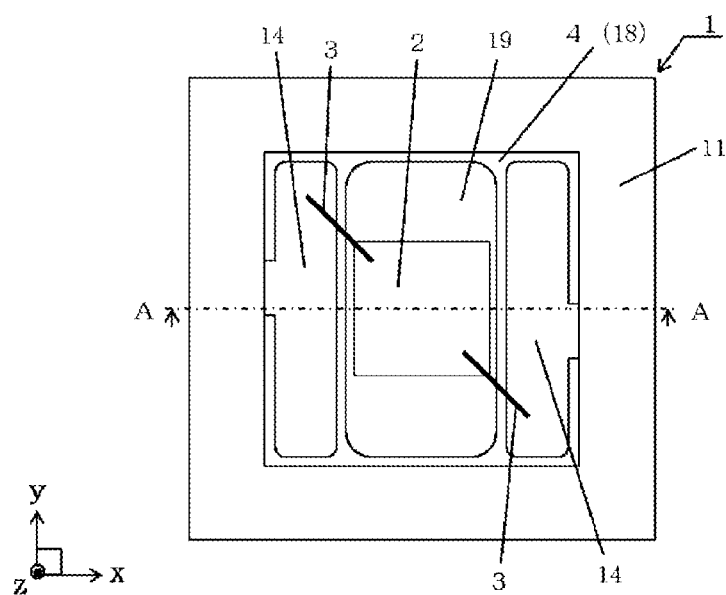
FIG. 11A is a top view of an electronic device according to a third embodiment of the present invention.
Figure 11B:
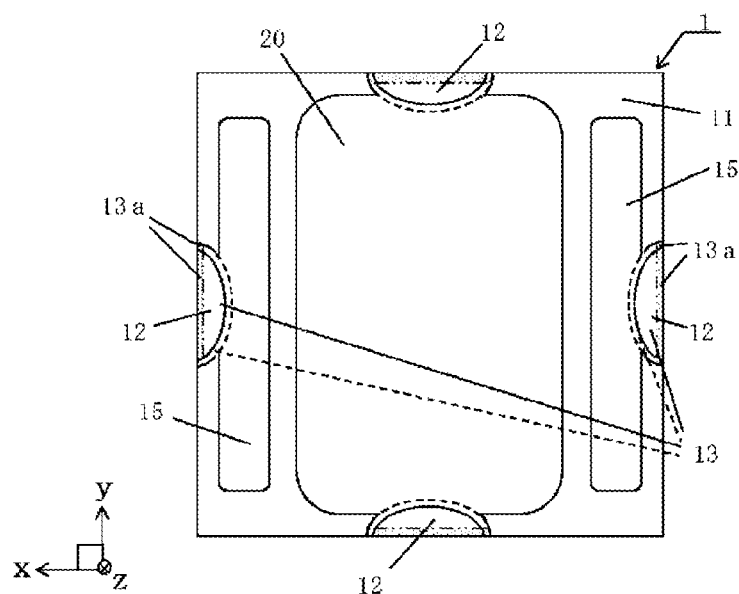
FIG. 11B is a bottom view of FIG. 11A.
Figure 12:
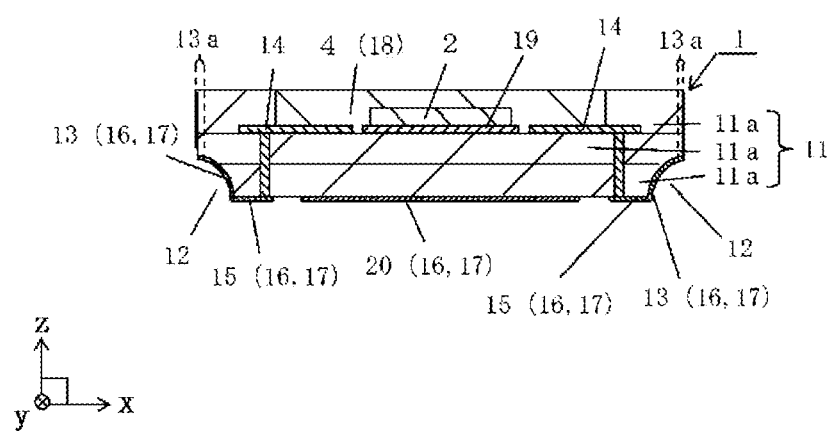
FIG. 12 is a cross-sectional view of the electronic device taken along the line A-A illustrated in FIG. 11A.

The electronic device according to the third embodiment of the present invention differs from the electronic device according to the first embodiment described above in that, as in the example illustrated in FIGS. 11A to 12, a cavity 18 is provided in the top face of the insulating base 11.

Like the first embodiment, a wiring board according to the third embodiment of the present invention prevents the solder 6 from being formed in the outer periphery section 13a of the inner-face electrode 13, which prevents stress produced by a difference in thermal expansion between the wiring board 1 and the external circuit board 5a from acting on the outer periphery section 13a of the inner-face electrode 13 via the solder 6 and reduces the likelihood of the inner-face electrode 13 peeling off from the insulating base 11. This allows the wiring board 1 to be small, highly precise, and highly reliable in terms of electrical connection with the external circuit board 5a over long periods of time.

In the wiring board 1 according to the third embodiment, a depth of the notch portion 12 having a shape corresponding to a portion obtained by dividing a hemisphere having a semi-oval shape in plan view is set so as not to reach the height (depth) of the bottom face of the cavity 18, as in the example illustrated in FIGS. 11A to 12. This can minimize a decrease in strength of the insulating base 11 and can favorably form the notch portion 12 in the bottom face of the insulating base 11.

The insulating base 11 includes the cavity 18 in the top face thereof, as in the example illustrated in FIGS. 11A to 12. This cavity 18 may be formed as follows: forming a through-hole that will become the cavity 18 in a plurality of the ceramic green sheets through laser processing, punching processing using a die, or the like; and laminating the ceramic green sheets on ceramic green sheets in which the through-hole is not formed. Additionally, in a case where the insulating base 11 is thin, the through-hole that will become the cavity 18 is preferably formed with precision through laser processing, punching processing using a die, or the like after the ceramic green sheets are laminated. Additionally, as in the example illustrated in FIGS. 11A to 12, the width of the notch portion 12 is approximately from 25% to 75% of the width of a side wall portion of the cavity 18.

In a case where the cavity 18 is a space for disposing a light-emitting element, an angle θ between an inner-side face of the cavity 18 and the bottom face of the cavity 18 is an obtuse angle and may specifically be an angle of from 110 degrees to 145 degrees. Having the angle θ be within this range makes it easy to form the inner-side faces of the through-hole that will become the cavity 18 in a stable and efficient manner through punching processing, and facilitates the miniaturization of a light emitting device using the wiring board 1. Also, the light-emitting element is able to favorably emit light toward the exterior. The cavity 18 having the inner-side face with the angle θ is formed by punching the ceramic green sheet by using a punching die which sets a clearance between a diameter of a punch and a diameter of a die hole to be large. That is, when the clearance of the diameter of the die hole is set to be larger than the diameter of the punch of the punching die, the green sheet is sheared from an edge of a contact surface with respect to the punch toward an edge of a contact surface with respect to the die hole and a diameter of the through hole is widened from the main surface side to the other main surface side when the ceramic green sheet is punched from the main surface side toward the other main surface side. At this time, the angle of the inside surface of the through hole formed in the ceramic green sheet can be adjusted by setting the clearance between the diameter of the punch and the diameter of the die hole in accordance with the thickness of the ceramic green sheet and so on. This punching method has high productivity because the angle θ made by the inside surface of the cavity 18 and the bottom surface of the cavity 18 can be set to a desired angle only by the punching process.

It is also preferable to form the through hole having the angle θ widening from one main surface side toward the other main surface side as described above by pressing a die having a frustum shape or a truncated pyramid shape onto the inside surface of the through hole after forming the through hole having the angle θ of approximately 90 degrees by the process using the punching die with a small clearance between the diameter of the punch and the diameter of the die hole. In such case, the angle θ made by the inside surface of the cavity 18 and the bottom surface of the cavity 18 can be adjusted more accurately.

In a case where the wiring board 1 includes, for example, the insulating base 11 having a top face that includes the cavity 18 on which a light-emitting element is mounted, the wiring board 1 may also be provided with a reflective layer for reflecting light emitted by the light-emitting element on the inner wall face of the cavity 18. The reflective layer includes, for example, a metal conductor layer disposed on the inner wall face of the cavity 18, and a plating layer deposited on the metal conductor layer. The metal conductor layer may be formed from the same materials and by the same method as those of the inner-face electrode 13 and the wiring conductor 14 or the main-face electrode 15.

For example, in a case where the light-emitting element is mounted on the wiring board 1, it is preferable that a silver plating layer be deposited on the outermost surface of the metal conductor layer and a gold plating layer be deposited on the outermost surfaces of the inner-face electrode 13, the wiring conductor 14, and the main-face electrode 15. This is because the gold plating layer has superior bonding properties with the electronic component 2, the connecting member 3, and the solder 6 in comparison to the silver plating layer. The silver plating layer, however, has high reflectivity with respect to light in comparison to the gold plating layer. Also, an alloy plating layer of gold and silver may be deposited on the wiring at the location where the light-emitting element is to be disposed, and on the outermost surface of the metal conductor layer. For example, an alloy plating layer of gold and silver as a complete solid solution may be used.

Like the first embodiment, the wiring board 1 according to the third embodiment can be advantageously used in a small, high-output electronic device and can provide excellent electrical connection therewith. For example, the wiring board can be advantageously used as a small wiring board for disposing a light-emitting element which is a high-luminous light-emitting element corresponding to the electronic component 2.

The wiring board 1 according to the third embodiment can be manufactured by using the same manufacturing method as that of the first embodiment.

Fourth Embodiment

Figure 13A:
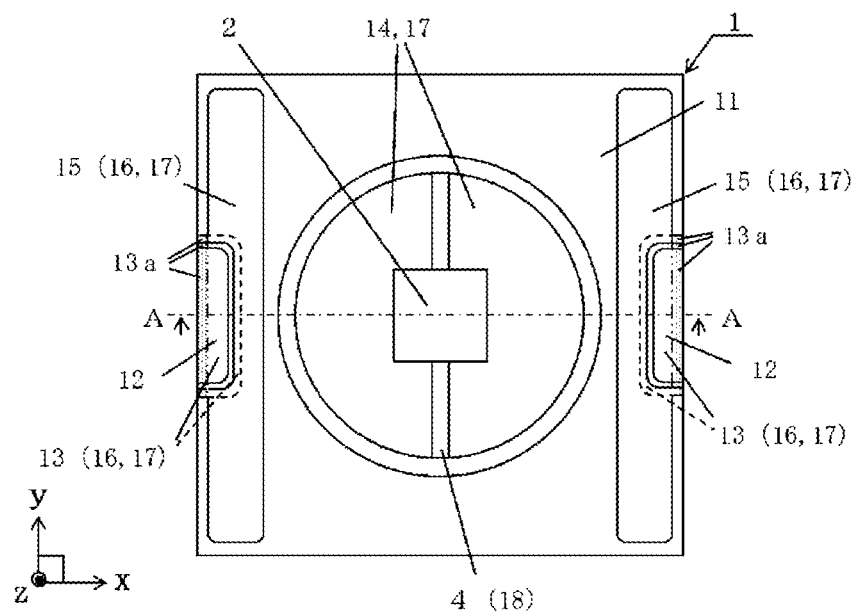
FIG. 13A is a top view of an electronic device according to a fourth embodiment of the present invention.
Figure 13B:
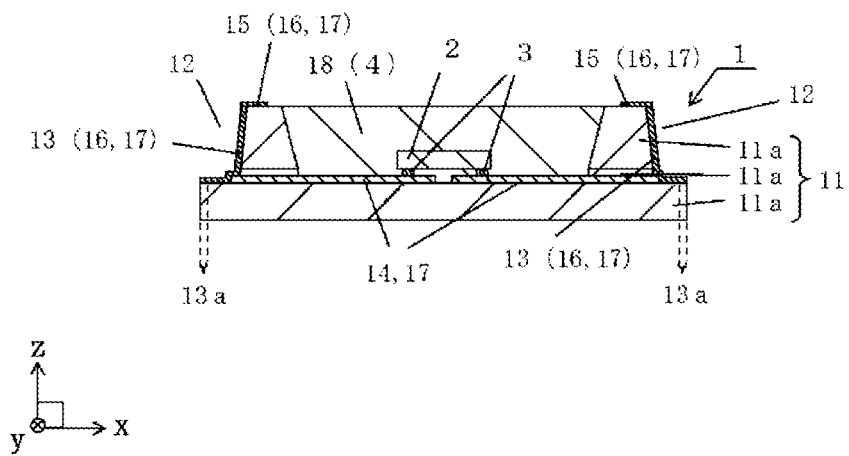
FIG. 13B is a cross-sectional view of FIG. 13A taken along the line A-A.

An electronic device according to a fourth embodiment of the present invention will be described next with reference to FIGS. 13A and 13B.

The electronic device according to the fourth embodiment of the present invention differs from the electronic device according to the first embodiment described above in that, as in the example illustrated in FIGS. 13A and 13B, the notch portion 12 is opened in one main face (hereinafter, also referred to as "top face") identical to as a disposing face for the electronic component 2 and a side face.

Like the wiring board according to the first embodiment, a wiring board according to the fourth embodiment of the present invention prevents the solder 6 from being formed in the outer periphery section 13a of the inner-face electrode 13, which prevents stress produced by a difference in thermal expansion between the wiring board 1 and the external circuit board 5a from acting on the outer periphery section 13a of the inner-face electrode 13 via the solder 6 and reduces the likelihood of the inner-face electrode 13 peeling off from the insulating base 11. This allows the wiring board 1 to be small, highly precise, and highly reliable in terms of electrical connection with the external circuit board 5a over long periods of time.

Additionally, the wiring board 1 can be bonded to the module board 5 with the solder 6 at the top face side thereof. As such, bonding a member having higher thermal conductivity than that of the insulating base 11 over the entirety of the bottom face side of the wiring board 1 allows heat radiating properties of the wiring board 1 to be improved. In a case where the insulating base 11 is made from an aluminum oxide-based sintered body, examples of the material having higher thermal conductivity than that of the insulating base 11 include a metal material such as copper (Cu), copper-tungsten (Cu—W), or aluminum (Al), an insulator made from an aluminum nitride-based sintered body, and the like. In such a wiring board 1, an amount of heat transmitted from the electronic component 2 disposed on the wiring board 1 to the notch portion 12 can be suppressed, which allows the wiring board to be highly reliable in terms of electrical connection with the module board 5 and to be excellent in heat radiation over long periods of time.

Like the first embodiment, the wiring board 1 according to the fourth embodiment can be advantageously used in a small, high-output electronic device and provides excellent electrical connection therewith. For example, the wiring board can be advantageously used as a small wiring board for disposing a light-emitting element which is a high-luminous light-emitting element corresponding to the electronic component 2.

The wiring board 1 according to the fourth embodiment can be manufactured by using the same manufacturing method as that of the second embodiment.

Fifth Embodiment

An electronic device according to a fifth embodiment of the present invention will be described next with reference to FIG. 14.

Figure 14:
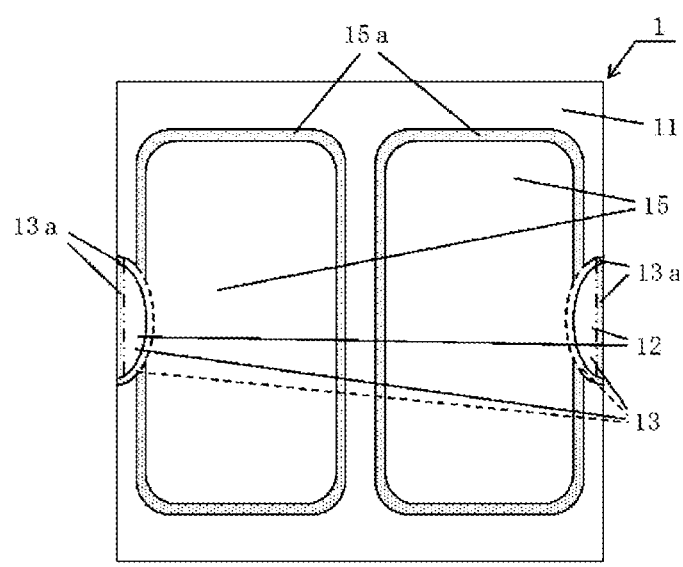
FIG. 14 is a bottom view of an electronic device according to a fifth embodiment of the present invention.
Figure 14:
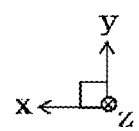

The electronic device according to the fifth embodiment of the present invention differs from the electronic device according to the first embodiment described above in that, as in the example illustrated in FIG. 14, the surface in an outer periphery section 15a of the main-face electrode 15 contains more nickel than gold and thus has low wettability with respect to the solder 6.

A wiring board according to the fifth embodiment of the present invention prevents the solder 6 from being formed in the outer periphery section 15a of the main-face electrode 15, which prevents stress produced by a difference in thermal expansion between the wiring board 1 and the module board 5 including the external circuit board 5a from acting on the outer periphery section 15a of the main-face electrode 15 via the solder 6 and reduces the likelihood of the main-face electrode 15 peeling off from the insulating base 11. Additionally, even when gaps between the plurality of main-face electrodes 15 are narrow on the main face of the insulating base 11, the occurrence of shorts can be suppressed, which allows the wiring board to be small, highly precise, and highly reliable in terms of electrical connection with the module board 5.

The surface in the outer periphery section 15a of the main-face electrode 15 can be formed so as to contain more nickel than gold and thus have low wettability with respect to the solder 6 by using the same method as the method for forming the surface in the outer periphery section 13a of the inner-face electrode 13 so as to contain more nickel than gold and thus have low wettability with respect to the solder 6.

The wiring board 1 according to the fifth embodiment can be manufactured by using the same manufacturing method as that of the first embodiment.

The present invention is not limited to the above-described embodiments, and various modifications are applicable. In the above-described examples, the notch portion 12 and the inner-face electrode 13 are disposed individually in each of two opposing side faces of the insulating base 11. However, the wiring board 1 may include the notch portion 12 and the inner-face electrode 13 disposed in all four side faces of the insulating base 11, or the notch portion 12 and the inner-face electrode 13 may be disposed in plurality on each edge of the wiring board 1. Additionally, in the examples illustrated in FIGS. 1A to 14, the insulating base 11 is formed of two or three insulating layers 11a. However, the insulating base 11 may be formed of a single insulating layer 11a, or four or more insulating layers 11a.

Additionally, although the notch portions 12 is opened in one main face and the side faces of the insulating base 11 in the examples illustrated in FIGS. 1A to 14, the notch portions 12 may be opened in both the main faces and the side faces of the insulating base 11.

Additionally, as in the example illustrated in FIGS. 11A to 12, the wiring board 1 may also include conductors other than wiring, such as an electronic component disposing layer 19 and a central terminal layer 20. For example, in a case where these conductors include the thin film layer 16 and the plating layer 17, the conductors can be formed from the same materials and by the same method as those of the inner-face electrode 13 or the main-face electrode 15 described above. In a case where the conductors are formed by the same method as that for forming the wiring conductor 14, the metal plating layer 17 is disposed on an exposed surface. The electronic component disposing layer 19 is, for example, used for disposing the electronic component 2, whereas the central terminal layer 20 is, for example, used for bonding the wiring board 1 to the module board 5, similarly to the inner-face electrode 13 and the main-face electrode 15. Additionally, as in the example illustrated in FIGS. 11A and 11B, the central terminal layer 20 may also be connected to the inner-face electrode 13 disposed on the inner face of the notch portion 12.

Additionally, the wiring boards 1 according to the first to fifth embodiments may have a flat-plate shape or may have the cavity 18. Furthermore, the wiring boards 1 according to the first to fifth embodiments may include the electronic component disposing layer 19, the central terminal layer 20, and the like.

Although only one electronic component 2 is disposed on the wiring board 1 in the above-described examples, a plurality of electronic components 2 may be disposed on the wiring board 1.

Additionally, the wiring board 1 may also be manufactured as a multipiece wiring board.

REFERENCE SIGNS LIST

1 Wiring board
11 Insulating base
11a Insulating layer
12 Notch portion
13 Inner-face electrode
13a Outer periphery section of inner-face electrode
14 Wiring conductor
15 Main-face electrode
16 Thin film layer
17 Plating layer
18 Cavity
19 Electronic component mounting layer
20 Central terminal layer
2 Electronic component
3 Connecting member
4 Encapsulant
5 Module board
5a External circuit board
51 Connection pad
6 Solder

The invention claimed is:

1. A wiring board comprising:
an insulating base comprising a main face;
a side face;
a notch portion opened in the main face and the side face; and
an inner-face electrode disposed on an inner face of the notch portion and to be connected to an external circuit board with solder therebetween,
wherein, the inner-face electrode contains:
nickel and gold at a surface portion thereof;
more nickel than gold at a surface in an outer periphery section; and
more gold than nickel at a surface in an inner region.

2. The wiring board according to claim 1,
wherein the outer periphery section is disposed along an opening of the notch portion adjacent to the side face.

3. The wiring board according to claim 1,
wherein the inner face of the notch portion is a curved surface.

4. The wiring board according to claim 1,
wherein the notch portion has a shape corresponding to a portion obtained by dividing a truncated quadrangular pyramid, and the notch portion has a width of an opening adjacent to the main face greater than a width of a bottom portion.

5. An electronic device comprising:
the wiring board according to claim 1; and
an electronic component disposed on the wiring board and electrically connected to the inner-face electrode.

6. An electronic module comprising:
a module board comprising a connection pad on a main face thereof; and
the electronic device according to claim 5, wherein the inner-face electrode is connected to the connection pad with solder therebetween.

7. The wiring board according to claim 2,
wherein the inner face of the notch portion is a curved surface.

8. The wiring board according to claim 2,
wherein the notch portion has a shape corresponding to a portion obtained by dividing a truncated quadrangular pyramid, and the notch portion has a width of an opening adjacent to the main face greater than a width of a bottom portion.

* * * * *